US012610524B2

(12) United States Patent
Han et al.

(10) Patent No.: US 12,610,524 B2
(45) Date of Patent: Apr. 21, 2026

(54) MEMORY STRUCTURE, SEMICONDUCTOR STRUCTURE AND METHOD FOR MAMUFACTURING SAME

(71) Applicant: CHANGXIN MEMORY TECHNOLOGIES, INC., Hefei City (CN)

(72) Inventors: Qinghua Han, Hefei (CN); JeongGi Kim, Hefei (CN); Gyuseog Cho, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 382 days.

(21) Appl. No.: 18/447,338

(22) Filed: Aug. 10, 2023

(65) Prior Publication Data

US 2024/0040768 A1      Feb. 1, 2024

Related U.S. Application Data

(63) Continuation of application No. PCT/CN2022/113009, filed on Aug. 17, 2022.

(30) Foreign Application Priority Data

Aug. 1, 2022      (CN) .......................... 202210916785.1

(51) Int. Cl.
*H10B 12/00*                (2023.01)
(52) U.S. Cl.
CPC ............. *H10B 12/30* (2023.02); *H10B 12/05* (2023.02)
(58) Field of Classification Search
CPC ........ H10B 12/30; H10B 12/05; H10B 12/01; H10B 12/03; H10B 12/33
See application file for complete search history.

(56) References Cited

U.S. PATENT DOCUMENTS 10,396,034 B2      8/2019  Siew et al.
2002/0192914 A1    12/2002  Kizilyalli
(Continued)

FOREIGN PATENT DOCUMENTS

CN      102468326 A      5/2012
CN      107919357 A      4/2018
(Continued)

OTHER PUBLICATIONS

First Office Action of the Taiwanese application No. 112126780, issued on Feb. 15, 2024, 10 pages with English abstract.
(Continued)

*Primary Examiner* — S M Sohel Imtiaz
(74) *Attorney, Agent, or Firm* — Syncoda LLC; Feng Ma

(57)        ABSTRACT

Provided are a memory structure, a semiconductor structure and a method for manufacturing same. The semiconductor structure includes: a substrate, isolation structures provided in the substrate, delimiting an active area in the substrate, the active area including a channel region, and a source region and a drain region at opposite sides of the channel region; a gate structure, located on an upper surface of the substrate and covering the channel region; a source and a drain, located at opposite sides of the gate structure, respectively, the source in contact with the source region, the drain in contact with the drain region, and each of the source and the drain having a tooth-shaped portion; and a first contact plug and a second contact plug, located at the opposite sides of the gate structure, respectively, and connected to the tooth-shaped portion of the source and the tooth-shaped portion of the drain, respectively.

9 Claims, 7 Drawing Sheets

(56) References Cited

U.S. PATENT DOCUMENTS

| | | | | |
|---|---|---|---|---|
| 2007/0138570 | A1* | 6/2007 | Chong | H10D 62/021 |
| | | | | 257/377 |
| 2007/0287240 | A1* | 12/2007 | Chen | H10D 62/83 |
| | | | | 257/E21.633 |
| 2008/0283906 | A1* | 11/2008 | Bohr | H10D 30/62 |
| | | | | 257/190 |
| 2009/0184374 | A1* | 7/2009 | Clevenger | H10D 84/017 |
| | | | | 257/E21.409 |
| 2011/0147815 | A1* | 6/2011 | Takeda | H10D 30/797 |
| | | | | 257/E21.409 |
| 2012/0104466 | A1 | 5/2012 | Zhu et al. | |
| 2012/0132966 | A1 | 5/2012 | Doris | |
| 2012/0208332 | A1 | 8/2012 | Doris | |
| 2012/0217553 | A1 | 8/2012 | Luo | |
| 2013/0175606 | A1 | 7/2013 | Cheng | |
| 2013/0175626 | A1 | 7/2013 | Cheng | |
| 2013/0207189 | A1 | 8/2013 | Cheng | |
| 2014/0332903 | A1 | 11/2014 | Cheng | |
| 2014/0349459 | A1 | 11/2014 | Cheng | |
| 2015/0221768 | A1 | 8/2015 | Zhong | |
| 2018/0096934 | A1 | 4/2018 | Siew | |
| 2019/0165156 | A1 | 5/2019 | Lin et al. | |
| 2019/0333856 | A1 | 10/2019 | Siew | |
| 2020/0303255 | A1 | 9/2020 | Hung | |
| 2020/0303512 | A1 | 9/2020 | Lee et al. | |
| 2021/0391451 | A1 | 12/2021 | Chen et al. | |
| 2022/0020854 | A1 | 1/2022 | Mu | |
| 2022/0199534 | A1 | 6/2022 | Siew | |
| 2023/0402457 | A1* | 12/2023 | Lu | H10D 84/0188 |
| 2024/0379789 | A1* | 11/2024 | Chu | H01L 21/28123 |

FOREIGN PATENT DOCUMENTS

| | | |
|---|---|---|
| CN | 111640799 A | 9/2020 |
| CN | 113380885 A | 9/2021 |
| TW | 201935570 A | 9/2019 |
| TW | 202036913 A | 10/2020 |
| TW | 202201799 A | 1/2022 |

OTHER PUBLICATIONS

International Search Report in the international application No. PCT/CN2022/113009, mailed on Dec. 20, 2022. 3 Pages.

* cited by examiner

S100 providing a substrate, in which an isolation structure is provided in the substrate, which defines active areas in the substrate; the active area includes a channel region, and a source region and a drain region respectively located at two opposite sides of the channel region; and a gate structure is provided on an upper surface of the substrate, and the gate structure covers the channel region

S200 forming a source and a drain, in which the source and the drain are respectively located at two opposite sides of the gate structure, in which the source is in contact with the source region, the drain is in contact with the drain region; and each of the source and the drain has a tooth-shaped portion

S300 forming a first contact plug and a second contact plug, in which the first contact plug and the second contact plug are located at the two opposite sides of the gate structure, respectively, and are connected to the tooth-shaped portion of the source and the tooth-shaped portion of the drain, respectively

FIG. 1

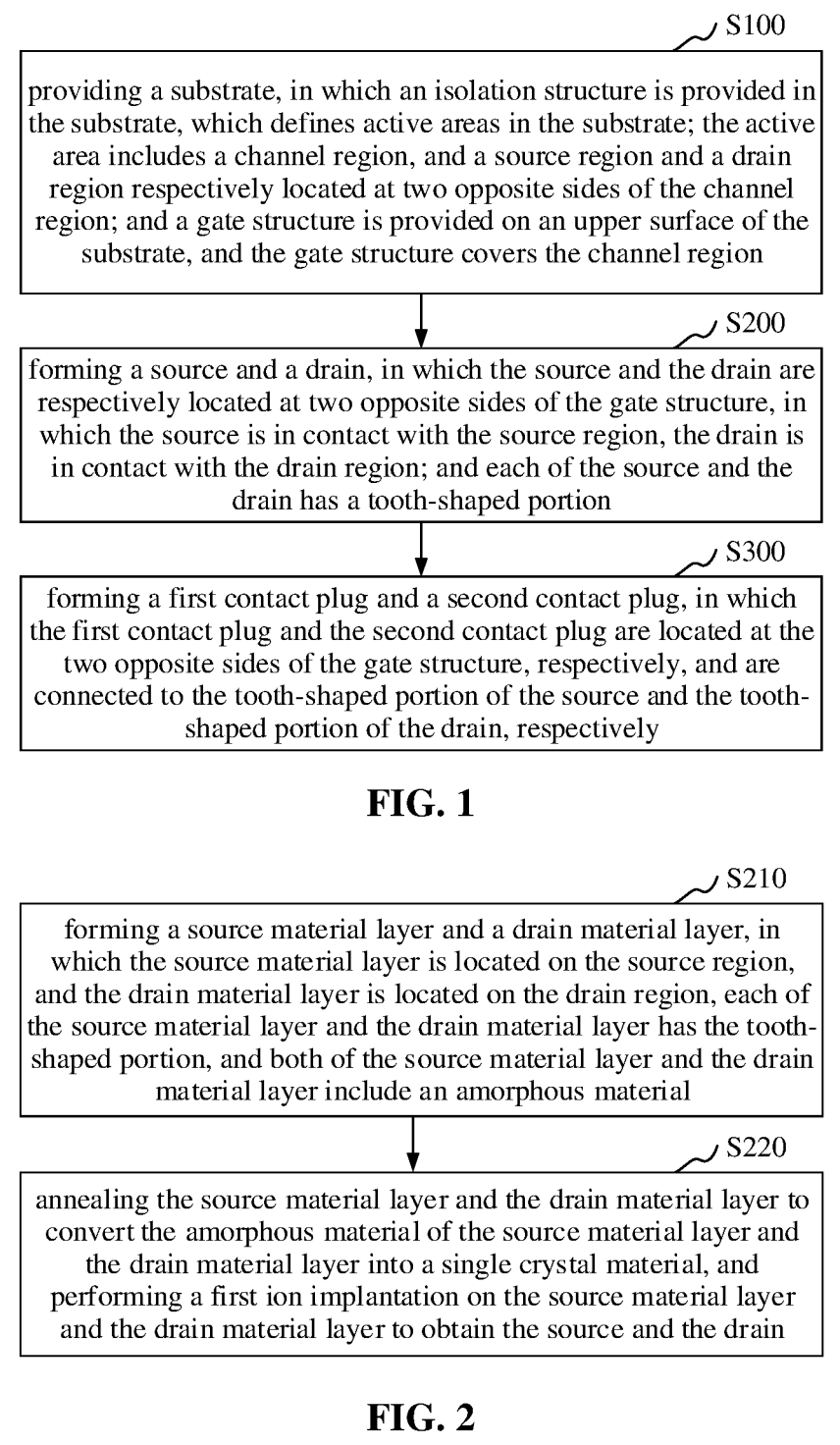

S210 forming a source material layer and a drain material layer, in which the source material layer is located on the source region, and the drain material layer is located on the drain region, each of the source material layer and the drain material layer has the tooth-shaped portion, and both of the source material layer and the drain material layer include an amorphous material

S220 annealing the source material layer and the drain material layer to convert the amorphous material of the source material layer and the drain material layer into a single crystal material, and performing a first ion implantation on the source material layer and the drain material layer to obtain the source and the drain

FIG. 2

forming an initial amorphous material layer, in which the initial amorphous material layer covers the upper surface of the substrate and a surface of the gate structure etching, vertically, the initial amorphous material layer to retain the initial amorphous material layer that is located on the active area at the two opposite sides of the channel region as the source material layer and the drain material layer

FIG. 3

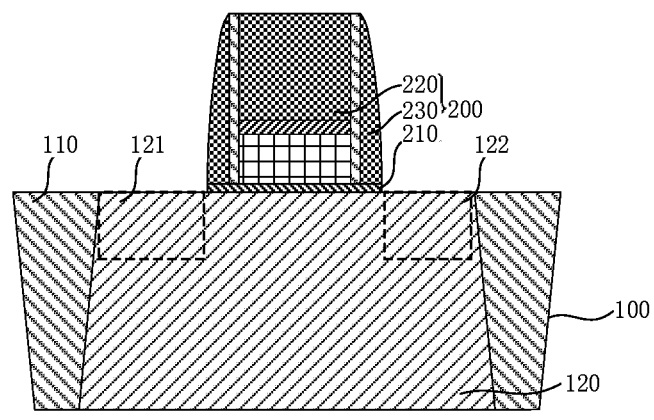

FIG. 4

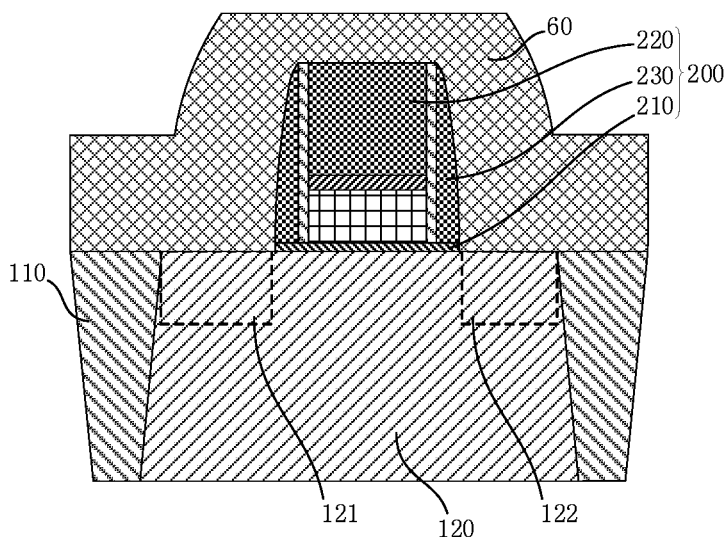

FIG. 5

MEMORY STRUCTURE, SEMICONDUCTOR STRUCTURE AND METHOD FOR MAMUFACTURING SAME

CROSS-REFERENCE TO RELATED APPLICATIONS

The application is a continuation application of International Application No. PCT/CN2022/113009, filed on Aug. 17, 2022, which claims priority to Chinese Patent Application No. 202210916785.1, filed on Aug. 1, 2022. The disclosures of International Application No. PCT/CN2022/113009 and Chinese Patent Application No. 202210916785.1 are hereby incorporated by reference in their entireties.

BACKGROUND

A dynamic random access memory (DRAM) is a semiconductor memory, with the best advantage of its small layout area. Compared with a static random access memory, the DRAM has relatively complicated control circuits, access circuits and refresh circuits.

However, for the DRAM, the miniaturization of its semiconductor process technology has had a significant impact on contact regions of transistors. In other words, since semiconductor structures are highly integrated and miniaturized, areas of the transistor contact regions are also reduced. However, those reduced areas lead to an increase of contact resistance and a decrease of driving current, which affects the performance of the transistors. Therefore, how to reduce the contact resistance of the transistors is an urgent problem to be solved at present.

SUMMARY

Embodiments of the disclosure relate to a technical field of semiconductor manufacture, in particular to a memory structure, a semiconductor structure and a method for manufacturing the semiconductor structure.

According to various embodiments of the disclosure, a memory structure, a semiconductor structure and a method for manufacturing the same are provided.

According to some embodiments, in one aspect, embodiments of the disclosure provide a semiconductor structure, which includes a substrate, a gate structure, a source and a drain, and a first contact plug and a second contact plug.

Isolation structures are provided in the substrate, which delimit an active area in the substrate. The active area includes a channel region, and a source region and a drain region located at two opposite sides of the channel region.

The gate structure is located on an upper surface of the substrate and covers the channel region.

The source and the drain are located at two opposite sides of the gate structure, respectively, in which the source is in contact with the source region, the drain is in contact with the drain region, and each of the source and the drain has a tooth-shaped portion.

The first contact plug and the second contact plug are respectively located at the two opposite sides of the gate structure, and are connected to the tooth-shaped portion of the source and the tooth-shaped portion of the drain, respectively.

In another aspect, according to some embodiments, embodiments of the disclosure also provide a method for manufacturing a semiconductor structure comprising the following operations.

A substrate is provided, in which isolation structures are provided in the substrate, which isolate an active area in the substrate; the active area includes a channel region, and a source region and a drain region respectively located at two opposite sides of the channel region; and a gate structure is provided on an upper surface of the substrate, and the gate structure covers the channel region.

A source and a drain are formed, in which the source and the drain are respectively located at two opposite sides of the gate structure, the source is in contact with the source region, the drain is in contact with the drain region, and each of the source and the drain has a tooth-shaped portion.

A first contact plug and a second contact plug are formed, in which the first contact plug and the second contact plug are respectively located at the two opposite sides of the gate structure, and are respectively connected to the tooth-shaped portion of the source and the tooth-shaped portion of the drain.

In yet another aspect, according to some embodiments, embodiments of the disclosure also provide a memory structure including the semiconductor structure provided by any of the above embodiments.

The memory structure, the semiconductor structure and the method for manufacturing the semiconductor structure provided by the embodiments of the disclosure have at least the following beneficial effects.

In the semiconductor structure provided by the embodiments of the disclosure, the source and the drain are located on the upper surface of the substrate and thus form the elevated source and drain, which are higher than the horizontal plane of the substrate. As such, the depth of the source/drain PN junction in the channel region is reduced, thereby alleviating the short channel effect in the semiconductor structure. In addition, the elevated source and drain also reduce the resistances of the source and drain. Meanwhile, in the semiconductor structure provided by the embodiments of the disclosure, the source and the drain have the tooth-shaped portions, respectively, and the first contact plug and the second contact plug are connected to the tooth-shaped portion of the source and the tooth-shaped portion of the drain, respectively, so that the contact area between the source and the first contact plug and the contact area between the drain and the second contact plug can be increased, thereby reducing the contact resistance and further avoiding the impact of the reduction of the driving current on the performance of the semiconductor structure.

According to the method for manufacturing a semiconductor structure provided by the embodiments of the disclosure, by forming the source and the drain located on the upper surface of the substrate to form the elevated source and drain which are higher than the horizontal plane of the substrate, the depth of the source/drain PN junction in the channel region is reduced, thereby alleviating the short channel effect in the semiconductor structure. The elevated source and drain also reduce the source and drain resistances.

Meanwhile, according to the method for manufacturing a semiconductor structure provided by the embodiments of the disclosure, by forming the source and the drain each having the tooth-shaped portion, and by connecting the first contact plug and the second contact plug to the tooth-shaped portion of the source and the tooth-shaped portion of the drain, respectively, the contact area between the source and the first contact plug and the contact area between the drain and the second contact plug are increased, thereby reducing the contact resistances and further avoiding the impact of the reduction of the driving current on the performance of the semiconductor structure.

The memory structure provided by the embodiments of the disclosure includes the semiconductor structure provided by the aforementioned embodiments, and the technical effects achieved by the semiconductor structure are also achieved by the memory structure, which are not repeated here.

Details of one or more embodiments of the disclosure are set forth in the following drawings and descriptions. Other features, objects and advantages of the embodiments of the disclosure will become apparent from the description, the drawings and the claims.

BRIEF DESCRIPTION OF THE DRAWINGS

In order to more clearly illustrate the technical solutions of the embodiments of the disclosure, the drawings used for the description of the embodiments are briefly introduced below. Apparently, the following described drawings are some of the embodiments of the disclosure. For those of ordinary skill in the art, drawings of other embodiments can be obtained according to these drawings without involving creative efforts.

FIG. 1 is a flowchart of a method for manufacturing a semiconductor structure provided by some embodiments of the disclosure;

FIG. 2 is a flowchart of S200 of a method for manufacturing a semiconductor structure provided by some embodiments of the disclosure;

FIG. 3 is a flowchart of S210 of a method for manufacturing a semiconductor structure provided by some embodiments of the disclosure;

FIG. 4 to FIG. 14 are schematic cross-sectional structural diagrams of structures obtained in respective operations of a method for manufacturing a semiconductor provided by some embodiments of the disclosure; and FIG. 14 is also a schematic cross-sectional structural diagram of a semiconductor structure provided by some embodiments of the disclosure.

DETAILED DESCRIPTION

Figure 6:
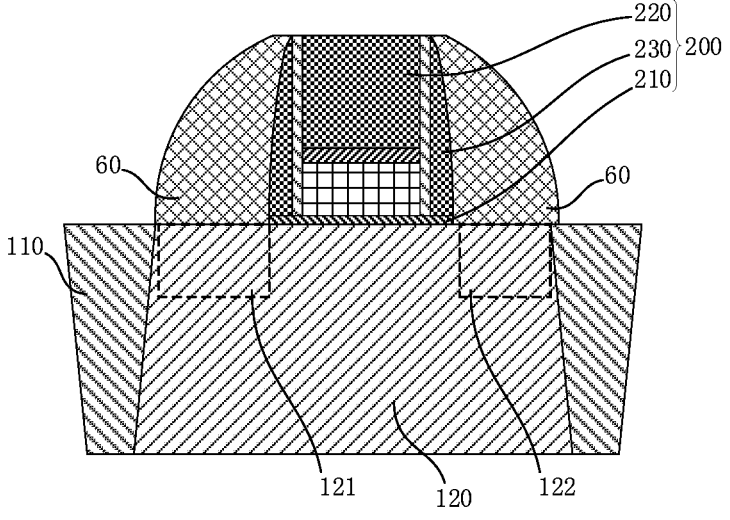

In order to facilitate understanding of the embodiments of the disclosure, the embodiments of the disclosure will be described more comprehensively hereinafter with reference to the corresponding drawings. Preferred embodiments of the disclosure are shown in the drawings. However, the embodiments of the disclosure may be implemented in many different forms and are not limited to the embodiments described herein. In contrast, these embodiments are provided to make the disclosure of the embodiments of the invention more thorough and comprehensive.

Unless otherwise defined, all technical and scientific terms used herein have the same meaning as commonly understood by those skilled in the art to which the embodiments of the disclosure belong. The terms used in the specification of the embodiments of the disclosure are for the purpose of describing specific embodiments only and are not intended to limit the embodiments of the disclosure.

It should be understood that when an element or layer is referred to as being "located on", "located on an upper surface" or "connected to" other elements or layers, it may be directly located on the other elements or layers, or on the upper surface of the other elements or layers, or connected to the other elements or layers; or an intermediate element or layer may be present. It should be understood that although terms first, second and the like may be used to describe various elements, components, regions, layers, doping types and/or sections, these elements, components, regions, layers, doping types and/or sections should not be limited by these terms. These terms are only used to distinguish one element, component, region, layer, doping type or section from another element, component, region, layer, doping type or section. Therefore, without departing from the teaching of the disclosure, a first element, component, region, layer, doping type or section discussed below may be represented as a second element, component, region, layer, doping type or section. For example, a first contact plug may be referred to as a second contact plug, and similarly, a second contact plug may be referred to as a first contact plug. The first contact plug and the second contact plug are different contact plugs, for example, a first contact plug may be connected to a source and a second contact plug may be connected to a drain, or the first contact plug may be connected to the drain and the second contact plug may be connected to the source.

Spatial relation terms, such as "located on", "located on an upper surface" and the like, may be used herein for describing a relationship between one element or feature shown in the drawings and other elements or features. It should be understood that in addition to orientations shown in the drawings, the spatial relation terms further include the different orientations of a device in use and operation. For example, if the device in the drawings is turned over, then the elements or the features described as "located on" or "located on an upper surface" may be oriented "under" other elements or features. Thus, the exemplary terms "located on" or "located on an upper surface" may include both upper and lower orientations. In addition, the device may be otherwise oriented (such as rotated 90 degrees or other orientations) and the spatial relation terms used herein are interpreted accordingly.

As used here, singular forms of "a", "an" and "said/the" are also intended to include plural forms, unless otherwise clearly indicated in the context. It should also be understood that terms "consisting of" and/or "comprising/including" used in the description, demonstrate the presence of the described features, integers, steps, operations, elements and/or components, but do not exclude the presence or addition of one or more other features, integers, steps, operations, elements, components, and/or groups. Moreover, as used herein, the term "and/or" includes any and all combinations of related items listed.

Embodiments of the disclosure are described herein with reference to cross-sectional views of schematic diagrams of ideal embodiments (and intermediate structures) of the embodiments of the disclosure, so that variations in illustrated shapes due to, for example, manufacturing techniques and/or tolerances can be expected. Thus, embodiments of the embodiments of the disclosure should not be limited to the specific shapes of regions shown herein, but include shape deviations due to, for example, manufacturing techniques. The areas shown in the drawings are schematic, and their shapes do not represent the actual shapes of the areas of a device and should not limit the scope of the disclosed embodiments.

Reference is made to FIG. 1 to FIG. 14. It should be noted that the diagrams provided in the embodiments only schematically show the basic conception of the disclosure. Although the diagrams only show the components related to the embodiments of the disclosure and are not drawn according to the numbers, shapes and sizes of the components in actual implementation, the forms, quantities and proportions of the components in the actual implementation may be arbitrarily changed, and the layout form of the components may be more complex.

A dynamic random access memory (DRAM) is a semiconductor memory, with the best advantage of its small layout area. Compared with a static random access memory, the DRAM has relatively complicated control circuits, access circuits and refresh circuits.

However, for the DRAM, the miniaturization of semiconductor process technology has had a significant impact on contact regions of transistors. In other words, since semiconductor structures are highly integrated and miniaturized, areas of the transistor contact regions are also reduced. However, this reduced areas lead to an increase of contact resistance and a decrease of driving current, which affects the performance of the transistors.

Based on this, according to some embodiments, the embodiments of the disclosure provide a method for manufacturing a semiconductor.

Referring to FIG. 1, according to some embodiments, the method for manufacturing a semiconductor includes the following operations.

At S100, a substrate is provided. Isolation structures are provided in the substrate, which isolate an active area in the substrate. The active area includes a channel region, and a source region and a drain region located at two opposite sides of the channel region. A gate structure is provided on an upper surface of the substrate, covering the channel region.

At S200, a source and a drain are formed. The source and the drain are respectively located at two opposite sides of the gate structure. The source is in contact with the source region, and the drain is in contact with the drain region. The source and the drain each have a tooth-shaped portion.

At S300, a first contact plug and a second contact plug are formed. The first contact plug and the second contact plug are respectively located at the two opposite sides of the gate structure, and are respectively connected to the tooth-shaped portion of the source and the tooth-shaped portion of the drain.

According to the method for manufacturing a semiconductor structure provided by the above embodiments, by forming the source and the drain located on the upper surface of the substrate to form the elevated source and drain, which are higher than the horizontal plane of the substrate. As such, the depth of the source/drain PN junction in the channel region is reduced, thereby alleviating the short channel effect in the semiconductor structure; and the elevated source and drain also reduce the source and drain resistances. Moreover, according to the method for manufacturing a semiconductor structure provided by the embodiments of the disclosure, by forming the source and the drain each having the tooth-shaped portion, and by connecting the first contact plug and the second contact plug to the tooth-shaped portion of the source and the tooth-shaped portion of the drain, respectively, the contact area between the source and the first contact plug and the contact area between the drain and the second contact plug are increased, thereby reducing the contact resistance and further avoiding the influence of the reduction of the driving current on the performance of the semiconductor structure.

According to some embodiments, providing the substrate at S100 includes providing a single crystal substrate.

Referring to FIG. 2, according to some embodiments, forming the source and the drain at S200 includes the following operations.

At S210, a source material layer and a drain material layer are formed. The source material layer is located on the source region, and the drain material layer is located on the drain region. The source material layer and the drain material layer each have the tooth-shaped portion, and include an amorphous material.

At S220, the source material layer and the drain material layer are annealed to convert the amorphous material of the source material layer and the drain material layer into a single crystal material, and a first ion implantation is performed on the source material layer and the drain material layer to obtain the source and the drain.

Referring to FIG. 3, according to some embodiments, forming the source material layer and the drain material layer at S210 includes the following operations.

At S211, an initial amorphous material layer is formed. The initial amorphous material layer covers the upper surface of the substrate and an upper surface of the gate structure.

At S212, the initial amorphous material layer is vertically etched to retain the initial amorphous material layer that is located on the active area at the two opposite sides of the channel region as the source material layer and the drain material layer.

According to some embodiments, vertically etching the initial amorphous material layer to retain the initial amorphous material layer that is located on the active area at the two opposite sides of the channel region as the source material layer and the drain material layer includes the following operation.

Part of the initial amorphous material layer is removed in its height, and the resulting structure is vertically etched until the tooth-shaped portions are formed at the top of the initial amorphous material layer that is located on the active area at the two opposite sides of the channel region.

According to some embodiments, after the first ion implantation is performed on the source material layer and the drain material layer, a first isolation sidewall material layer and a second isolation sidewall material layer are formed. The first isolation sidewall material layer and the second isolation sidewall material layer respectively cover sidewalls of the two opposite sides of the gate structure, the first isolation sidewall material layer is located between the gate structure and the tooth-shaped portion of the source, and the second isolation sidewall material layer is located between the gate structure and the tooth-shaped portion of the drain.

According to some embodiments, forming the source and the drain further includes: performing a second ion implantation on the tooth-shaped portion of the source and the tooth-shaped portion of the drain after the first isolation sidewall material layer and the second isolation sidewall material layer are formed.

According to some embodiments, after the second ion implantation on the tooth-shaped portion of the source and the tooth-shaped portion of the drain is performed, the method further includes the following operations.

A covering dielectric layer is formed. The covering dielectric layer covers the gate structure and the substrate.

A first through hole and a second through hole are formed. The first through hole and the second through hole are at least located in the covering dielectric layer, the first through hole at least exposes the tooth-shaped portion of the source, and the second through hole at least exposes the tooth-shaped portion of the drain.

The first contact plug is filled in the first through hole, and the second contact plug is filled in the second through hole.

7

According to some embodiments, each of the source and the drain has a connection portion.

The connection portion is located between the tooth-shaped portion and the gate structure, and a height of the connection portion is less than a height of the tooth-shaped portion, as such a gap is present between the tooth-shaped portion and the gate structure.

According to some embodiments, during the course of forming the first through hole and the second through hole, part of the first isolation sidewall material layer and part of the second isolation sidewall material layer are removed to obtain a first isolation sidewall and a second isolation sidewall; the first through hole extends to a position between the first isolation sidewall and the tooth-shaped portion of the source, and exposes the connection portion of the source; and the second through hole extends to a position between the second isolation sidewall and the tooth-shaped portion of the drain, and exposes the connection portion of the drain.

According to some embodiments, the first contact plug wraps a top end of the tooth-shaped portion of the source and extends to contact the connection portion of the source; and the second contact plug wraps a top end of the tooth-shaped portion of the drain and extends to contact the connection portion of the drain.

In order to more clearly illustrate the method in some of the above embodiments, some of the embodiments of the disclosure are understood in combination with FIG. 4 to FIG. 14.

At S100, referring to FIG. 4, a substrate 100 is provided. Isolation structures 110 are formed in the substrate 100, and the isolation structures 110 isolate an active area 120 in the substrate 100. The active area 120 includes a channel region, and a source region 121 and a drain region 122 respectively located at two opposite sides of the channel region. A gate structure 200 is formed on an upper surface of the substrate 100, which covers the channel region.

The material of the substrate 100 is not limited in the embodiments of the disclosure. As an example, the material of the substrate 100 may include, but is not limited to any one of or more of silicon (Si), silicon carbide (SiC), gallium nitride (GaN), gallium arsenide (GaAs), sapphire, glass or the like.

According to some embodiments, the substrate 100 includes a single crystal substrate.

The structure of the gate structure 200 is not specially limited in the embodiments of the disclosure. As an example, the gate structure 200 may include a gate dielectric layer 210, a gate stack layer structure 220 and gate sidewalls 230.

Herein, the gate dielectric layer 210 is located on the channel region, the gate stack layer structure 220 is located on the upper surface of the gate dielectric layer 210, the projection of the gate stack layer structure 220 on the substrate 100 falls in the projection of the gate dielectric layer 210 on the substrate 100, and the gate sidewalls 230 are located on the upper surface of the gate dielectric layer 210, and on two opposite sides of the gate stack layer structure 220, respectively.

The structure of the gate stack layer structure 220 is not specially limited in the embodiments of the disclosure. As an example, the gate stack layer structure 220 may include, but is not limited to a tungsten (W) layer and a polysilicon (Poly) layer stacked in sequence from bottom up, or a titanium nitride (TiN) layer and a polysilicon (Poly) layer stacked in sequence from bottom up.

The material of the gate dielectric layer 210 is not specially limited in the embodiments of the disclosure. According to some embodiments, the gate dielectric layer 210 may include a silicon oxynitride (SiON) layer.

In other embodiments, the material of the gate dielectric layer 210 may include a high-K dielectric material to facilitate reducing the leakage current of the gate structure 200.

According to some embodiments, the gate dielectric layer 210 includes a high-K dielectric material, and a metal layer is used in the gate stack layer structure 220 instead of the polysilicon layer, and thus constituting a high-K dielectric material and metal gate (HKMG) structure. In this way, the pinning phenomenon of Fermi level can be improved, and the metal layer has an extremely high electron density, which effectively solves the gate depletion problem caused by the polysilicon layer.

At S200, referring to FIG. 5 to FIG. 11, a source 300 and a drain 400 are formed.

The source 300 and the drain 400 are respectively located at two opposite sides of the gate structure 200, the source 300 is in contact with the source region 121, and the drain 400 is in contact with the drain region 122. The source 300 and the drain 400 each have a tooth-shaped portion a.

As an example, operation of S200 specially includes operations of S210 to S220.

At S210, referring to FIG. 5 to FIG. 10, a source material layer 30 and a drain material layer 40 are formed.

The source material layer 30 is located on the source region 121, and the drain material layer 40 is located on the drain region 122. The source material layer 30 and the drain material layer 40 each have the tooth-shaped portion a. The materials of both of the source material layer 30 and the drain material layer 40 include an amorphous material.

Figure 11:
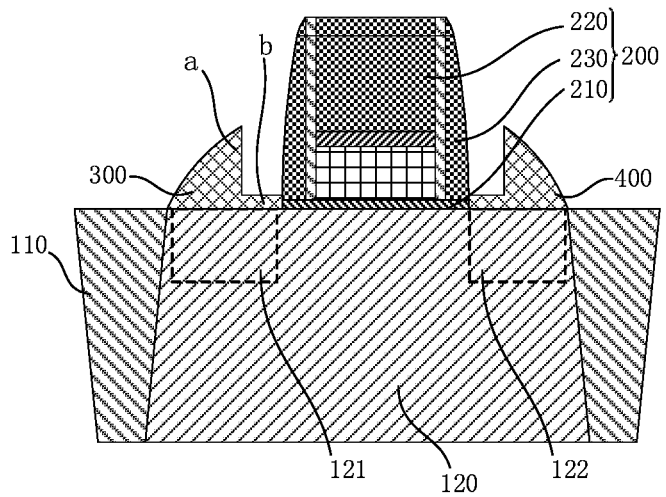

At S220, referring to FIG. 11, the source material layer 30 and the drain material layer 40 are annealed to convert the amorphous material of the source material layer 30 and the drain material layer 40 into a single crystal material, and a first ion implantation is performed on the source material layer 30 and the drain material layer 40 to obtain the source 300 and the drain 400.

As an example, the first ion implantation includes a lightly doped drain (LDD) ion implantation process.

As an example, the operation of S210 specially includes operations of S211 to S212.

At S211, referring to FIG. 5, an initial amorphous material layer 60 is formed. The initial amorphous material layer 60 covers the upper surface of the substrate 100 and the surface of the gate structure 200.

At S212, referring to FIG. 6 to FIG. 9, the initial amorphous material layer 60 is vertically etched, and the initial amorphous material layer 60 that is located on the active area 120 at two opposite sides of the channel region is retained as the source material layer 30 and the drain material layer 40.

The thickness of the initial amorphous material layer 60 formed at S211 is not specially limited in the embodiments of the disclosure. As an example, the thickness of the initial amorphous material layer 60 may be 30 nm to 80 nm. For example, the thickness of the initial amorphous material layer 60 may be 30 nm, 40 nm, 50 nm, 60 nm, 70 nm, 80 nm or the like.

It can be understood that, the thickness of the initial amorphous material layer 60 formed at S211 delimits the widths of the source material layer 30 and the drain material layer 40.

According to some embodiments, referring to FIG. 6 to FIG. 9, at S212, etching, vertically, the initial amorphous material layer 60 and thus retaining the initial amorphous material layer 60 that is located on the active area 120 at the two opposite sides of the channel region as the source material layer 30 and the drain material layer 40 includes the following operation.

Part of the initial amorphous material layer 60 is removed in its height, and the resulting structure is vertically etched until tooth-shaped portions a are formed at the top of the initial amorphous material layer 60 that is located on the active area 120 at the two opposite sides of the channel region.

The depth of the vertical etching at S212 is not specially limited in the embodiments of the disclosure. As an example, the depth of the vertical etching at S212 may be 0.3 to 0.7 times of the height of the gate structure 200. For example, the depth of vertical etching may be 0.3 times, 0.4 times, 0.5 times, 0.6 times, or 0.7 times of the height of the gate structure 200, or the like.

As an example, the process for forming the tooth-shaped portions a on the top of the initial amorphous material layer 60 that is located on the active area 120 at the two opposite sides of the channel region is realized, for example, in the following manner.

Figure 7:
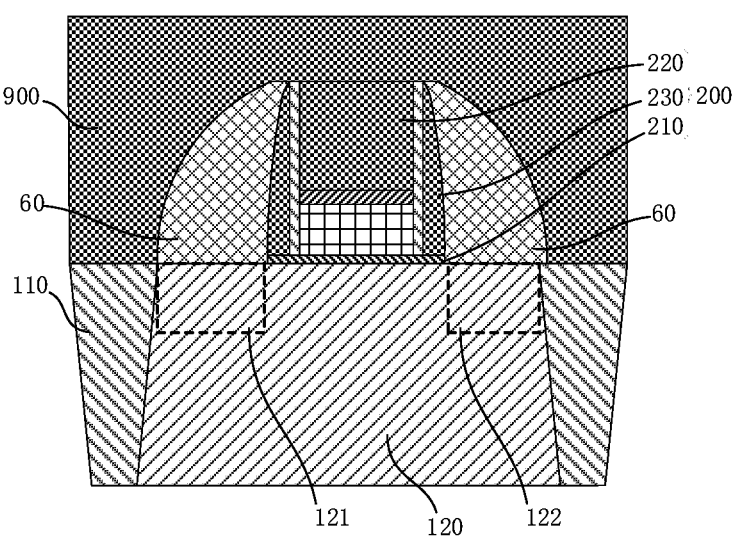
Figure 8:
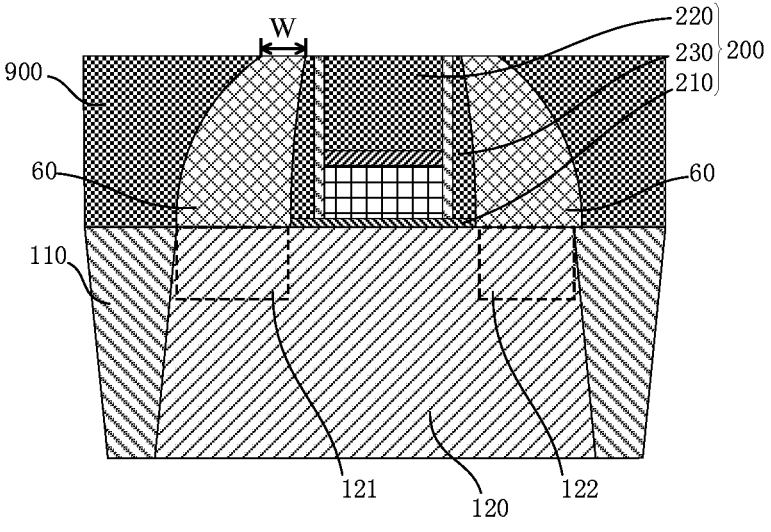

As shown in FIG. 7, a mask layer 900 covering the initial amorphous material layer 60, the gate structure 200 and the upper surface of the substrate 100 is formed. As shown in FIG. 8, part of the mask layer 900 is removed in its height by taking the upper surface of the gate structure 200 as a stop reference layer, then the resulting structure is planarized, and then a polishing process is performed based on the planarized structure, so that openings are formed in the mask layer 900 to exposing top portion of the initial amorphous material layer 60.

The material of the mask layer 900 is not specially limited in the embodiments of the disclosure. As an example, the mask layer 900 may be formed by, but not limited to a process of spin on carbon (SOC). There is a good selectivity ratio between SOC and the substrate, thus SOC is easy to be removed. Moreover, the means of planarization of the resulting structure in the above process is not specially limited in the embodiments of the disclosure. As an example, the resulting structure may be planarized by, but not limited to a process of chemical mechanical polishing (CMP).

Figure 9:
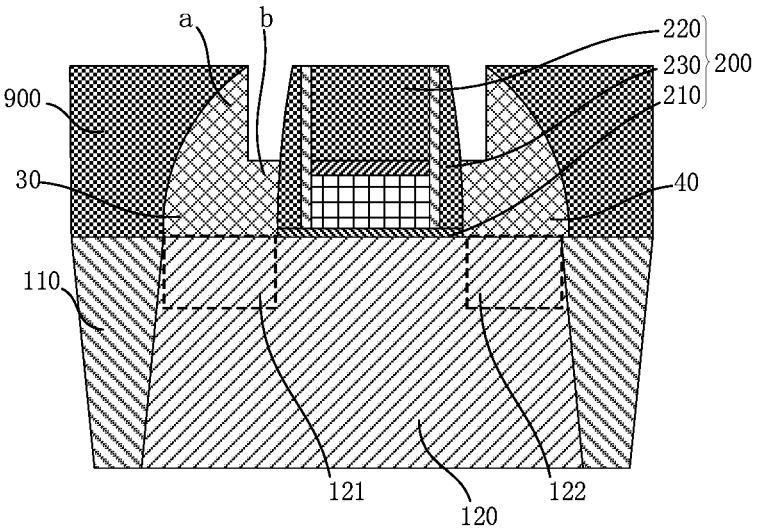

As shown in FIG. 9, after forming the openings exposing the top portions of the initial amorphous material layer 60, the initial amorphous material layer 60 is vertically etched from the exposed top portions thereof based on the remaining mask layer 900 and the gate structure 200 as a mask until the tooth-shaped portions a are formed on the top of the initial amorphous material layer 60 that is located on the active area 120 at the two opposite sides of the channel region.

Figure 10:
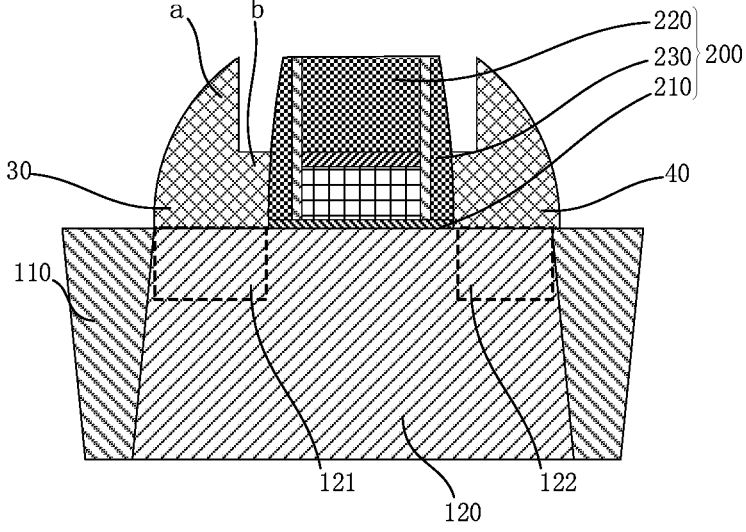

Referring to FIG. 10, it is understood that, after forming the tooth-shaped portions a on the top of the initial amorphous material layer 60, the mask layer 900 is removed.

The means to remove the mask layer 900 is not specially limited in the embodiments of the disclosure. As an example, the mask layer 900 is removed by, but not limited to a dry etch ashing process.

Sizes of the openings formed in the mask layer 900 for forming the tooth-shaped portions a are not specially limited in the embodiments of the disclosure. As an example, the width W of the openings may be 20 nm to 40 nm. For example, the width W of the opening may be 20 nm, 25 nm, 30 nm, 35 nm, 40 nm, or the like.

Still referring to FIG. 11, according to some embodiments, the source 300 and the drain 400 each have a connection portion b. Each of the connection portions b is located between the tooth-shaped portion a and the gate structure 200, and the height of the connection portion b is less than the height of the tooth-shaped portion a, so that there is a gap between the tooth-shaped portion a and the gate structure 200.

It should be noted that, the height of the tooth-shaped portions a in the embodiment of the disclosure is the maximum height of the tooth-shaped portions a.

According to some embodiments, before annealing the source material layer 30 and the drain material layer 40 at S220, an operation of surface cleaning of the source material layer 30 and the drain material layer 40 is also included to ensure that the mask layer 900 is removed completely, so that the amorphous materials of the source material layer 30 and the drain material layer 40 can be converted into the single crystal material in a higher quality manner.

For example, at S220, the source material layer 30 and the drain material layer 40 are subjected to perform an annealing treatment to convert the amorphous material of the source material layer 30 and the drain material layer 40 to the single crystal material by a process of solid phase epitaxy (SPE).

As an example, the source material layer 30 and the drain material layer 40 is annealed in an environment at a temperature of 400° C. to 600° C. For example, the source material layer 30 and the drain material layer 40 may be annealed in an environment at a temperature of 400° C., 450° C., 500° C., 550° C., 600° C., or the like.

Figure 12:
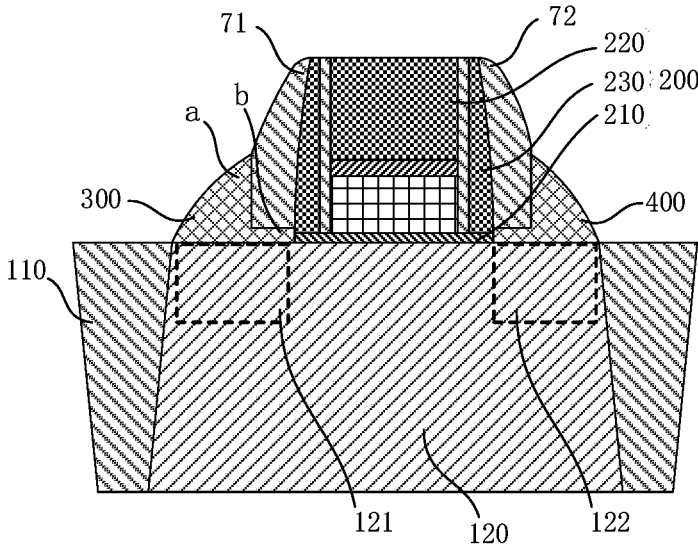

According to some embodiments, referring to FIG. 12, after the first ion implantation is performed on the source material layer 30 and the drain material layer 40 at S220, the method further includes an operation of forming a first isolation sidewall material layer 71 and a second isolation sidewall material layer 72.

For example, the first isolation sidewall material layer 71 and the second isolation sidewall material layer 72 respectively cover sidewalls of the two opposite sides of the gate structure 200. The first isolation sidewall material layer 71 is located between the gate structure 200 and the tooth-shaped portion a of the source 300, and the second isolation sidewall material layer 72 is located between the gate structure 200 and the tooth-shaped portion a of the drain 400.

The manner for forming the first isolation sidewall material layer 71 and the second isolation sidewall material layer 72 is not limited in the embodiments of the disclosure. As an example, the first isolation sidewall material layer 71 and the second isolation sidewall material layer 72 is formed, for example, in the following manner.

First, an isolation material layer is formed. The isolation material layer covers the upper surface of the substrate 100, the surface of the gate structure 200, the upper surface of the source 300, and the upper surface of the drain 400. Secondly, part of the isolation material layer is removed (for example, part of the isolation material layer is removed by an etching process), to retain the isolation material layer located on the two opposite sidewalls of the gate structure 200 as the first isolation sidewall material layer 71 and the second isolation sidewall material layer 72, respectively.

According to some embodiments, forming the source 300 and the drain 400 at S200 after forming the first isolation sidewall material layer 71 and the second isolation sidewall material layer 72 further includes an operation of performing a second ion implantation on the tooth-shaped portions a.

It should be noted that, in the embodiment of the disclosure, the type of implanted ions in the second ion implantation may be the same as the type of implanted ions in the first ion implantation. In the embodiments of the disclosure, the first ion implantation refers to a certain ion implantation operation, and the second ion implantation refers to another ion implantation operation after the certain ion implantation operation.

In the method provided by the above embodiments, after performing the first ion implantation on the source material layer 30 and the drain material layer 40 to obtain the source 300 and the drain 400, the second ion implantation is performed on the tooth-shaped portions a, so that the leakage current in the device is reduced.

Figure 13:
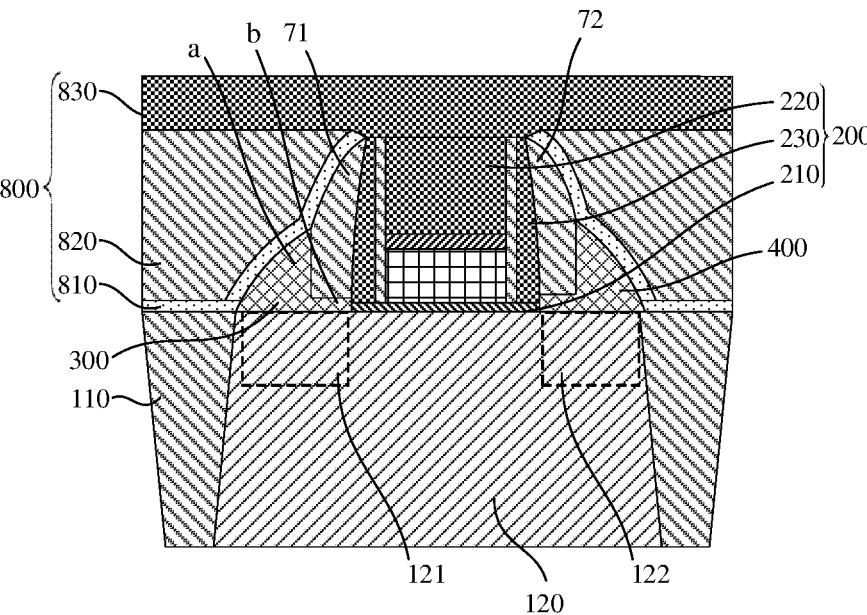

According to some embodiments, referring to FIG. 13, after forming the source 300 and the drain 400, the following operations are included.

A covering dielectric layer 800 is formed. The covering dielectric layer 800 covers the gate structure 200 and the substrate 100, and the covering dielectric layer 800 has a first through hole and a second through hole. The first through hole at least exposes the tooth-shaped portion a of the source 300, and the second through hole at least exposes the tooth-shaped portion a of the drain 400. It can be understood that, the first through hole is used to subsequently accommodate a first contact plug, and the second through hole is used to subsequently accommodate a second contact plug.

It should be noted that, in the above embodiments, the first isolation sidewall material layer 71 and the second isolation sidewall material layer 72 are formed before forming the covering dielectric layer 800.

According to some embodiments, still referring to FIG. 13, the process of forming the covering dielectric layer 800 includes the following operations.

A first cap layer 810 located around the opposite sides of the gate structure 200 (including: such as the first cap layer 810 directly located on the sidewalls of the gate structure 200; or such as, as shown in FIG. 13, the first cap layer 810 located on each of the sidewalls of the first isolation sidewall material layer 71 and the second isolation sidewall material layer 72 away from the gate structure 200, in the embodiment where the first isolation sidewall material layer 71 and the second isolation sidewall material layer 72 are formed) and on the upper surface of the substrate 100 is formed. A second cap layer 820 covering the first cap layer 810 is formed. A third cap layer 830 covering the second cap layer 820 is formed.

According to some embodiments, the first through hole and the second through hole respectively penetrate through the first cap layer 810, the second cap layer 820 and the third cap layer 830.

Figure 14:
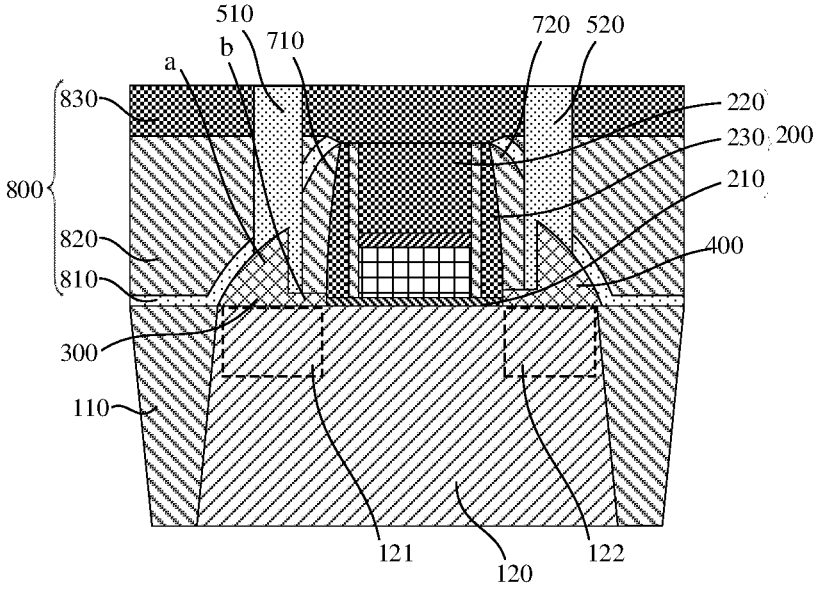

According to some embodiments, part of the first isolation sidewall material layer 71 and part of the second isolation sidewall material layer 72 may be removed to obtain the first isolation sidewall 710 and the second isolation sidewall 720 during forming the first through hole and the second through hole. As shown in FIG. 14, the first isolation sidewall 710 is located between the gate structure 200 and the tooth-shaped portion a of the source 300, and the second isolation sidewall 720 is located between the gate structure 200 and the tooth-shaped portion a of the drain 400.

According to some embodiments, referring to FIG. 14, the process of forming the first isolation sidewall 710 and the second isolation sidewall 720 includes the following operations.

When forming the first through hole and the second through hole, part of the first isolation sidewall material layer 71 and part of the second isolation sidewall material layer 72 are removed. After removing the part of the first isolation sidewall material layer 71 and the part of the second isolation sidewall material layer 72, the remaining first isolation sidewall material layer 71 and the remaining second isolation sidewall material layer 72 are taken as the first isolation sidewall 710 and the second isolation sidewall 720, respectively.

In the above embodiments, the first through hole extends to a position between the first isolation sidewall 710 and the tooth-shaped portion a of the source 300, and exposes the connection portion b of the source 300. Meanwhile, the second through hole extends to a position between the second isolation sidewall 720 and the tooth-shaped portion a of the drain 400, and exposes the connection portion b of the drain 400.

At S300, still referring to FIG. 14, a first contact plug 510 and a second contact plug 520 are formed.

The first contact plug 510 and the second contact plug 520 are respectively located at the two opposite sides of the gate structure 200, and are respectively connected to the tooth-shaped portion a of the source 300 and the tooth-shaped portion a of the drain 400.

According to some embodiments, still referring to FIG. 14, the first isolation sidewall 710 is located between the gate structure 200 and the first contact plug 510, and the second isolation sidewall 720 is located between the gate structure 200 and the second contact plug 520.

According to some embodiments, still referring to FIG. 14, the first contact plug 510 wraps the top end of the tooth-shaped portion a of the source 300; moreover, the second contact plug 520 wraps the top end of the tooth-shaped portion a of the drain 400.

According to the method for manufacturing a semiconductor structure provided by the above embodiments, the first contact plug 510 and the second contact plug 520 respectively wrap the top ends of a corresponding tooth-shaped portion a, so that the contact area between the source 300 and the first contact plug 510 and the contact area between the drain 400 and the second contact plug 520 are increased, thereby reducing the contact resistances and avoiding the impact of the reduction of the driving current on the performance of the semiconductor structure.

According to some embodiments, still referring to FIG. 14, the first contact plug 510 wraps the top end of the tooth-shaped portion a of the source 300 and extends to contact the connection portion b of the source 300; meanwhile, the second contact plug 520 wraps the top end of the tooth-shaped portion a of the drain 400 and extends to contact the connection portion b of the drain 400.

According to the method for manufacturing a semiconductor structure provided by the above embodiments, the first contact plug 510 and the second contact plug 520 respectively extend to contact the corresponding connection portion b, which further increases the contact area between the source 300 and the first contact plug 510 and the contact area between the drain 400 and the second contact plug 520, thereby further reducing the contact resistances.

According to some embodiments, still referring to FIG. 14, the first contact plug 510 is filled in the first through hole of the covering dielectric layer 800, and a second contact plug 520 is filled in the second through hole of the covering dielectric layer 800.

In another aspect, according to some embodiments, embodiments of the disclosure also provide a semiconductor structure.

Still referring to FIG. 14, according to some embodiments, the semiconductor structure includes a substrate 100, a gate structure 200, a source 300 and a drain 400, and a first contact plug 510 and a second contact plug 520.

Isolation structures 110 are provided in the substrate 100, delimiting an active area 120 in the substrate 100. The active area 120 includes a channel region, and a source region 121 and a drain region 122 respectively located at two opposite sides of the channel region.

The gate structure 200 is located on the upper surface of the substrate 100 and covers the channel region.

The source 300 and the drain 400 are respectively located at two opposite sides of the gate structure 200, and the source 300 is in contact with the source region 121, and the drain 400 is in contact with the drain region 122. The source 300 and the drain 400 each have a tooth-shaped portion a.

The first contact plug 510 and the second contact plug 520 are respectively located at the two opposite sides of the gate structure 200, and are connected to the tooth-shaped portion a of the source 300 and the tooth-shaped portion a of the drain 400, respectively.

In the semiconductor structure provided by the above embodiments, the source 300 and the drain 400 are located on the upper surface of the substrate 100 to form the elevated source and drain, which are higher than the horizontal plane of the substrate 100, so that the depth of the source/drain PN junction in the channel region is reduced, thereby alleviating the short channel effect in the semiconductor structure. The elevated source and drain also reduce the source/drain resistances. Moreover, in the semiconductor structure provided by the embodiments of the disclosure, the source 300 and the drain 400 each have a tooth-shaped portion a, and the first contact plug 510 and the second contact plug 520 are respectively connected to the tooth-shaped portion a of the source 300 and the tooth-shaped portion a of the drain 400, so that the contact area between the source 300 and the first contact plug 510 and the contact area between the drain 400 and the second contact plug 520 are increased, thereby reducing the contact resistances and further avoiding the impact of the reduction of the driving current on the performance of the semiconductor structure.

Still referring to FIG. 14, according to some embodiments, the source 300 and the drain 400 each have a connection portion b. Each of the connection portion b is located between the tooth-shaped portion a and the gate structure 200. The height of the connection portions b is less than the height of the tooth-shaped portions a.

Still referring to FIG. 14, according to some embodiments, the first contact plug 510 wraps the top end of the tooth-shaped portion a of the source 300; meanwhile, the second contact plug 520 wraps the top end of the tooth-shaped portion a of the drain 400.

In the semiconductor structure provided by the above embodiments, the first contact plug 510 and the second contact plug 520 respectively wrap the top ends of a corresponding tooth-shaped portion a, so that the contact area between the source 300 and the first contact plug 510 and the contact area between the drain 400 and the second contact plug 520 are increased, thereby reducing the contact resistances and further avoiding the impact of reduction of the driving current on the performance of the semiconductor structure.

Still referring to FIG. 14, according to some embodiments, the first contact plug 510 wraps the top end of the tooth-shaped portion a of the source 300 and extends to contact the connection portion b of the source 300; meanwhile, the second contact plug 520 wraps the top end of the tooth-shaped portion a of the drain 400 and extends to contact the connection portion b of the drain 400.

In the semiconductor structure provided by the above embodiments, the first contact plug 510 and the second contact plug 520 extend to contact the corresponding connection portions b, respectively, which further increases the contact area between the source 300 and the first contact plug 510 and the contact area between the drain 400 and the second contact plug 520, thereby further reducing the contact resistances.

Still referring to FIG. 14, according to some embodiments, the semiconductor structure further includes a first isolation sidewall 710 and a second isolation sidewall 720. The first isolation sidewall 710 and the second isolation sidewall 720 respectively cover sidewalls of the two opposite sides of the gate structure 200, the first isolation sidewall 710 is located between the gate structure 200 and the first contact plug 510, and the second isolation sidewall 720 is located between the gate structure 200 and the second contact plug 520.

Still referring to FIG. 14, according to some embodiments, the semiconductor structure may also include a covering dielectric layer 800. The covering dielectric layer 800 covers the gate structure 200 and the substrate 100, and has a first through hole and a second through hole.

The first through hole at least exposes the tooth-shaped portion a of the source 300, and the second through hole at least exposes the tooth-shaped portion a of the drain 400.

According to some embodiments, the first contact plug 510 is filled in the first through hole, and the second contact plug 520 is filled in the second through hole.

Still referring to FIG. 14, according to some embodiments, the first through hole extends to a position between the first isolation sidewall 710 and the tooth-shaped portion a of the source 300, and exposes the connection portion b of the source 300. In the above embodiments, the first contact plug 510 also extends to a position between the first isolation sidewall 710 and the tooth-shaped portion a of the source 300, and is in contact with the connection portion b of the source 300. According to some embodiments, the second through hole o extends to a position between the second isolation sidewall 720 and the tooth-shaped portion a of the drain 400, and exposes the connection portion b of the drain 400. In the above embodiments, the second contact plug 520 also extends to a position between the second isolation sidewall 720 and the tooth-shaped portion a of the drain 400, and is in contact with the connection portion b of the drain 400.

Still referring to FIG. 14, according to some embodiments, the covering dielectric layer 800 includes a first cap layer 810, a second cap layer 820 and a third cap layer 830.

The first cap layer 810 is located around the opposite sides of the gate structure 200 and on the upper surface of the substrate 100. The second cap layer 820 covers the first cap layer 810. The third cap layer 830 covers the second cap layer 820.

According to some embodiments, the first through hole and the second through hole respectively penetrate through the first cap layer 810, the second cap layer 820 and the third cap layer 830.

According to some embodiments, the upper surface of the second cap layer 820 is flush with the top of the gate structure 200.

Still referring to FIG. 14, according to some embodiments, the gate structure 200 includes a gate dielectric layer 210, a gate stack layer structure 220 and gate sidewalls 230.

The gate dielectric layer 210 is located on the channel region. The gate stack layer structure 220 is located on the upper surface of the gate dielectric layer 210, and the projection of the gate stack layer structure 220 on the substrate 100 falls in the projection of the gate dielectric layer 210 on the substrate 100. The gate sidewalls 230 are located on the upper surface of the gate dielectric layer 210, and on two opposite sides of the gate stack layer structure 220, respectively.

In yet another aspect, according to some embodiments, the embodiments of the disclosure also provide a memory structure. The memory structure includes the semiconductor structure provided by any of the foregoing embodiments.

The memory structure provided by the above embodiments includes the semiconductor structure provided by the aforementioned embodiments, such that the technical effects achieved by the semiconductor structure can also be realized by the memory structure, which are not repeated here.

According to some embodiments, the memory structure includes a core region and a periphery region located at the periphery of the core region. It is noted that, the semiconductor structure related in the embodiments of the disclosure is located in the peripheral region of the memory structure.

As an example, the semiconductor structure is, but not limited to a transistor in a logic circuit disposed in the peripheral region of the memory structure.

It should be understood that, unless explicitly stated herein, there are no strict sequential restrictions on the preformation of the operations, and these operations can be performed in other sequences. Furthermore, at least part of the operations may include a plurality of sub-operations or stages, which are not necessarily completed at the same time, but may be performed at different times, and the preformation order of the sub-operations or stages is not necessarily in sequence, but may be performed in turn or alternately with other operations or at least part of sub-operations or stages of said other operations.

Each embodiment in the specification is described in a progressive manner and each embodiment focuses on the differences from other embodiments, so the same and similar parts among the embodiments may be referred to each other.

The technical features of the above-described embodiments may be arbitrarily combined, and not all possible combinations of the technical features in the above-described embodiments are described for the sake of concise description. However, as long as there is no contradiction in the combinations of these technical features, they belong to the scope of the specification.

The above-described embodiments are merely several embodiments of the disclosure which are specifically and detailedly described, but cannot therefore be construed as limitations to the scope of the application. It should be noted that, a number of variations and modifications may be made by those of ordinary skill in the art without departing from the concept of the disclosure, and fall within the protection scope of the disclosure. Therefore, the protection scope of the disclosure is subject to the protection scope of the claims.

The invention claimed is:

1. A method for manufacturing a semiconductor structure, comprising:

providing a substrate, wherein isolation structures are provided in the substrate; the isolation structures isolate an active area in the substrate; the active area comprises a channel region, and a source region and a drain region respectively located at two opposite sides of the channel region; and a gate structure is provided on an upper surface of the substrate, and the gate structure covers the channel region;

forming a source and a drain, wherein the source and the drain are respectively located at two opposite sides of the gate structure, the source is in contact with the source region, the drain is in contact with the drain region, and each of the source and the drain has a tooth-shaped portion; and forming a first contact plug and a second contact plug, wherein the first contact plug and the second contact plug are respectively located at the two opposite sides of the gate structure, and are respectively connected to the tooth-shaped portion of the source and the tooth-shaped portion of the drain;

wherein providing the substrate comprises providing a single crystal substrate; and forming the source and the drain comprises:

forming a source material layer and a drain material layer, wherein the source material layer is located on the source region, the drain material layer is located on the drain region, each of the source material layer and the drain material layer has a tooth-shaped portion, and both of the source material layer and the drain material layer comprise an amorphous material; and annealing the source material layer and the drain material layer to convert the amorphous material of the source material layer and the drain material layer into a single crystal material, and performing a first ion implantation on the source material layer and the drain material layer to obtain the source and the drain.

2. The method according to claim 1, wherein forming the source material layer and the drain material layer comprises:

forming an initial amorphous material layer, wherein the initial amorphous material layer covers the upper surface of the substrate and a surface of the gate structure; and etching, vertically, the initial amorphous material layer to retain the initial amorphous material layer that is located on the active area at the two opposite sides of the channel region as the source material layer and the drain material layer.

3. The method according to claim 2, wherein etching, vertically, the initial amorphous material layer to retain the initial amorphous material layer that is located on the active area at the two opposite sides of the channel region as the source material layer and the drain material layer, respectively, comprises:

removing part of the initial amorphous material layer in its height, and etching, vertically, the resulting structure until the tooth-shaped portions are formed at a top of the initial amorphous material layer that is located on the active area at the two opposite sides of the channel region.

4. The method according to claim 1, further comprising:

forming a first isolation sidewall material layer and a second isolation sidewall material layer after performing the first ion implantation on the source material layer and the drain material layer, wherein the first isolation sidewall material layer and the second isolation sidewall material layer cover sidewalls of the two opposite sides of the gate structure, respectively, the first isolation sidewall material layer is located between the gate structure and the tooth-shaped portion of the source, and the second isolation sidewall material layer is located between the gate structure and the tooth-shaped portion of the drain.

5. The method according to claim 4, wherein forming the source and the drain further comprises:

performing a second ion implantation on the tooth-shaped portion of the source and the tooth-shaped portion of the drain after forming the first isolation sidewall material layer and the second isolation sidewall material layer.

6. The method according to claim 5, further comprising: after performing the second ion implantation on the tooth-shaped portion of the source and the tooth-shaped portion of the drain, forming a covering dielectric layer, covering the gate structure and the substrate;

forming a first through hole and a second through hole, at least located in the covering dielectric layer, wherein the first through hole at least exposes the tooth-shaped portion of the source, and the second through hole at least exposes the tooth-shaped portion of the drain; and filling the first contact plug in the first through hole and filling the second contact plug in the second through hole.

7. The method according to claim 6, wherein each of the source and the drain has a connection portion, the connection portion is located between the tooth-shaped portion and the gate structure, and a height of the connection portion is less than a height of the tooth-shaped portion, such that a gap is located between the tooth-shaped portion and the gate structure.

8. The method according to claim 7, wherein during forming the first through hole and the second through hole, part of the first isolation sidewall material layer and part of the second isolation sidewall material layer are removed to obtain a first isolation sidewall and a second isolation sidewall; and wherein the first through hole extends to a position between the first isolation sidewall and the tooth-shaped portion of the source, and exposes the connection portion of the source; and the second through hole extends to a position between the second isolation sidewall and the tooth-shaped portion of the drain, and exposes the connection portion of the drain.

9. The method according to claim 8, wherein the first contact plug wraps a top end of the tooth-shaped portion of the source and extends to contact the connection portion of the source; and the second contact plug wraps a top end of the tooth-shaped portion of the drain and extends to contact the connection portion of the drain.

\* \* \* \* \*